United States Patent [19]

Phillips

[11] Patent Number: 4,857,425

[45] Date of Patent: Aug. 15, 1989

[54] MANUFACTURE OF INTEGRATED CIRCUITS USING HOLOGRAPHIC TECHNIQUES

[75] Inventor: Nicholas J. Phillips, Loughborough, England

[73] Assignee: Holtronic Technologies Limited, London, Great Britain

[21] Appl. No.: 67,207

[22] Filed: Jun. 26, 1987

[30] Foreign Application Priority Data

Jun. 30, 1986 [GB] United Kingdom ............... 8615908

[51] Int. Cl.$^4$ .......................... G02B 1/20; G03H 1/04
[52] U.S. Cl. ........................................... 430/1; 430/2; 430/311; 430/319; 430/327; 430/394; 430/396; 430/397; 350/3.67; 350/3.69; 350/3.8; 350/383
[58] Field of Search ................... 350/3.61, 3.67, 3.75, 350/3.85, 3.65, 3.69, 3.83, 6.4, 6.5, 3.6, 3.66, 3.68, 3.7, 3.8, 3.81; 355/2; 430/1, 311, 327, 394, 396, 2, 319, 397

[56] References Cited

U.S. PATENT DOCUMENTS

| | | | |
|---|---|---|---|
| 3,600,056 | 8/1971 | King | 355/2 |
| 3,630,593 | 12/1971 | Bartelt et al. | 430/396 |
| 3,635,540 | 1/1972 | Nassenstein | 430/1 |
| 3,677,634 | 7/1972 | Mathisen | 355/2 |
| 3,764,979 | 11/1973 | Gabor | 350/3.75 |
| 3,796,476 | 3/1974 | Frosch et al. | 350/3.61 |
| 3,798,036 | 3/1974 | Schnepf | 430/396 |
| 3,947,085 | 3/1976 | Mottier | 355/2 |
| 4,244,633 | 1/1981 | Kellie | 430/1 |
| 4,478,481 | 10/1984 | Fusek et al. | 350/3.85 |
| 4,674,824 | 6/1987 | Goodman et al. | 350/3.64 |
| 4,734,345 | 3/1988 | Nomura et al. | 430/311 |

FOREIGN PATENT DOCUMENTS

| | | |
|---|---|---|
| 1203115 | 1/1968 | United Kingdom . |
| 1231248 | 7/1968 | United Kingdom . |
| 1280681 | 7/1969 | United Kingdom . |
| 1306737 | 10/1970 | United Kingdom . |
| 1311909 | 3/1973 | United Kingdom . |
| 1331076 | 9/1973 | United Kingdom . |
| 1471764 | 4/1977 | United Kingdom . |

OTHER PUBLICATIONS

L. Kuhn, IBM Technical Disclosure, vol. 15, No. 10, Mar. 1973, pp. 3275-3276, entitled "Planar Beam Steering Bulk Acoustic Wave Transducer for High-Resolution Laser Beam Deflection".

Paper by K. A. Stetson in Applied Physics Letters (Oct. 1st, 1967) entitled "Holography With Total Internally Reflected Light".

Primary Examiner—Jose G. Dees
Assistant Examiner—Donald J. Loney
Attorney, Agent, or Firm—Stanger, Michaelson, Reynolds, Spivak & Tobia

[57] ABSTRACT

A method of manufacturing integrated circuits using holographic techniques by interference between an input beam and a reference beam generated from laser sources. A holographic image of the object formed on a mask window, is formed on recording emulsion coated on a glass slab by means of interference between the input beam which has passed through the mask and the reference beam which is reflected from the surface of a prism in contact with the glass slab. In order to reproduce the holographic image on a silicon slice which replaces the mask, the reference beam is replayed in the reverse direction through the prism such that the interference between the input beam and the replayed reference beam causes the holographic image to be created as a real image in the silicon slice.

15 Claims, 3 Drawing Sheets

MANUFACTURE OF INTEGRATED CIRCUITS USING HOLOGRAPHIC TECHNIQUES

FIELD OF THE INVENTION

The present invention relates to the manufacture of integrated circuits using holographic techniques.

BACKGROUND OF THE INVENTION

Integrated circuits are built in layers, by repeatedly coating silicon wafers with photo-sensitive chemicals, flooding the wafers with a flash of light through a negative image of the circuit pattern, called a mask, and then developing that image and covering the microscopic circuit lines with a thin layer of a metal conductor. Prior to fifteen years ago, when the circuit lines were broader, the image was printed by laying the mask on the wafer. However, as the integrated circuit lines were required to become smaller and smaller, a more sophisticated projection technique was used. The apparatus uses mirrors to focus the image of the mask onto the wafer, and also avoids the need for direct handling and contact with the wafer.

Although projection systems have improved productivity, they still use masks which have the same size as the integrated circuits on the wafer. In order to reduce line widths a stepper alignment system has been developed. This uses a mask which is between five and ten times the size of the chip, which means that the quality of the mask is not as critical as in a projection screen. The mask image is reduced by expensive high resolution lenses and focused on the silicon. However, lenses which are large enough to cover an entire 100 to 125 mm diameter chip do not exist, with the result that the system has to expose the wafer one chip at a time, stepping from chip to chip.

Whilst the stepper system had some advantages in that during the reduction of the mask image, the flaws on the mask were also reduced, with increasing reduction in size of the integrated circuit lines, serious problems arise and specks of dust, minute scratches or fingerprints can result in defective chips.

Thus with serious limitations occuring in the purely optical system, researchers have tried to develop other techniques.

These other techniques in turn have thier own problems. For example, X-ray aligners work like conventional projection gear, but they transmit X-rays, not light through the mask. Since the wavelength of X-rays is considerably smaller than that of light, they can define finer circuit geometries. However, the necessary chemicals needed to record the image are not readily available at a reasonable cost and moreover special masks are required since they have to be capable of stopping X-rays, these special masks being both fragile and expensive.

Another technique which has been tried involves the use of electron-beam exposure systems. However, these types of systems have extremely slow production rates, since they "write" each circuit line separately, as an overlapping series of dots, which is much more laborious than flooding large areas with a flash that instantly inprints a complete pattern. Thus whilst the electron-beam system is capable of producing masks of a high quality, the manufacturing technique required is far too slow to have practical application other than a few specialized fields.

Thus whilst X-ray systems and electron-beam systems do have specific advantages over the optical systems, they do have their limitations. For example, whilst one advantage of the X-ray system is that high resolution can be achieved due to the short wavelength utilized and another is that it is insensitive to soft defects, a new resist system will be required and X-rays are sensitive to proximity effects. Moreover, it will require "stepper" processing with all the problems of throughput and mechanical positioning associated with todays systems. X-ray masks will also require a new mask technology due to the necessity for special mask substrates and gold metallizing.

In recent years, researchers have come back to the possible use of some form of modified holographic system. The problem with the normal optical system is the fundamental physical limit imposed on the system by the wavelength of light which occurs with integrated circuit lines having a width of less then one micron $(1\times10^{-6}\text{m})$. Although it has been proposed that some of the above discussed problems can be overcome by use of a holographic technique, there are certain problems which have to be solved before such a holographic system can become a practical proposition.

One of these problems concerns the use of lasers in the holographic printing technique. Lasers provide coherent light of a given wavelength, whereas ordinary light is "incoherent" being made up usually of a range of wavelengths from the infra-red to the ultra-violet, the light being of radom phase.

It has been observed that when an integrated circuit structure is placed in a laser beam, the resulting image is "speckled", and this problem implies that the circuit images prepared by a holographic technique might have unacceptable flaws.

Another problem concerns the choice of materials for the transparent recording element which would be utilized in any suitable holographic technique. Thus a tried and tested form of holographic medium is in the form of ultra fine grain silver halide. Such a medium would unfortunately suffer from scattering of light from its grainy structure and that phenomenon would almost certainly lead to a loss of resolution of printed images. The most desirable recording medium would be low in scatter and absorption and would almost certainly be grainless. Photo-polymeric media whilst being photographically insensitive would largely avoid the difficulties posed by scatter and absorption. A number of examples of polymeric substances suitable for the process of recording phase holograms have been disclosed by Professor J. J. A. Robillard in British Patent Specification No. 1,471,764.

Given that one can select a suitable medium for recording on the basis of the previous arguments, the fundamental optical limitations of holography can prevent the achievement of the absolute maximum of resolution in the printed image.

DESCRIPTION OF THE PRIOR ART

A novel technique for making holograms which employs a reference beam that is totally reflected from the air emulsion boundary of the hologram plate is disclosed in a paper by K. A. Stetson in Applied Physics Letters (Oct. 1, 1967) entitled "Holography with total internally reflected light". This type of recording permits a very close spacing between the object and the hologram, thus greatly improving the resolution limitations of the recording process. FIG. 1 of the accompanying drawings diagrammatically illustrates the mechanism used to establish a reference beam which is totally reflected at the air emulsion boundary. The recording medium in which the hologram H is to be formed is placed against the surface of a prism P with oil between the glass surfaces in order to allow the collimated reference beam to pass through a first glass slab. The object O to be holographically recorded is provided on a second glass slab and is spaced apart from the first glass slab by means of spacers Q. In the diagram R is the reference beam and S is the subject beam. It should be noted that the reference beam R is directed into the first glass slab constituting the hologram plate at such an angle that it will totally reflect from the air/gelatin boundary. The subject beam S enters the hologram plate nearly normal to its surface and passes out through the small face of the prism P. The layer of oil between the prism P and the first glass slab on which the hologram H is to be formed permits the transmission of light through this interface. The reference beam R enters one of the side faces of the prism P nearly normal to its surface and by interference both before and after reflection with the subject beam S forms the hologram H in the emulsion on the upper surface of the first glass slab.

It should be noted that in the above construction the recording of the hologram was not a "contact print", but did in fact reconstruct a wavefront. The subject beam S was actually a spherical diverging beam and upon reconstruction via the conjugate of the reference beam, the conjugate of the subject beam converged to a focus at a distance equal to the radius of the original subject beam. With white light reconstruction a spectrum of colours was observed at the focal point which indicated the diffracted nature of the reconstruction.

It should be further noted that the hologram itself showed an order of magnitude less resolution than the reconstruction. The reconstruction was a positive image of the object, not a negative image as was the hologram, i.e. the dark areas on the hologram became bright areas upon reconstruction and vice versa.

Another paper by K. A. Stetson in Applied Physics Letters (June 1, 1968) discusses improved resolution and signal-to-noise ratio in total internal reflection holograms. Total internal reflection holograms are holograms which are made with either or both the subject and reference beams totally reflected from the air/emulsion surface of the hologram plate. When the reference beam is totally reflected and the subject beam is normally transmitted, it is possible to locate transparent objects very close to the hologram without obstructing the reference beam. In this paper K. A. Stetson concludes that the total internal reflection holograms are capable of producing images with a resolution comparable to high quality microscope lenses. Furthermore, the limiting factor in the image degradation of the total internal reflection holograms is the coherent background of scattered light from the photographic emulsion that gives a noisy quality to the images.

A method of manufacturing semiconductor components by the use of known holograms in conjunction with photo-etching techniques is disclosed in British Patent Specification No. 1,331,076. The invention is specifically directed to a method which facilitates the adjustment of the hologram used, or of the real image of the etching mask reconstructed from the hologram, with the etching pattern already located on the basic body. In the method described, the body of semiconductor material is coated with a photo lacquer and exposed to produce an etching pattern before each processing step. Each etching pattern is projected from a respective hologram. The hologram used for the production of the first etching mask has three adjusting marks recorded therein, the projections of which are imaged on the body to provide reference marks to facilitate resetting during the projection of each subsequent hologram. The reference marks remain on the surface of the body as reflective areas. The real images of the adjusting marks are reconstructed and brought into coincidence with respective reference marks. Such a technique is slow, tedious and not very accurate, as well as being rather costly.

SUMMARY OF THE INVENTION

It is therefore an object of the present invention to overcome all the above referred to disadvantages of the prior art discussed above in order to provide a holographic technique of manufacturing integrated circuits which will permit inexpensive, high-resolution wafer printing.

According to the present invention there is provided a method of manufacturing integrated circuits using holographic techniques including the steps of:

(a) providing a recording medium exhibiting negligible scatter and high resolution without shrinking or distorting during the course of manufacture.

(b) forming a volume holographic image of the integrated circuit on the recording medium by interference between an input beam of coherent light which passes through a mask window containing the design of the integrated circuit, and a reference beam of coherent light which is totally internally reflected at the surface on which the recording medium is located, the interference taking place both with the incident and the reflected reference beam;

(c) removing the mask window and placing in its place a silicon slice having a recording medium on which the formed holographic image is to be reproduced;

(d) forming an image of the hologram on the recording medium of the silicon slice by interference between the input beam and another reference beam which travels in the reverse direction from the first reference beam which forms the hologram; and (e) repeating step (d) with another silicon slice as many times as required to manufacture a plurality of silicon slices containing an image of the integrated circuit formed thereon.

The second reference beam may either be a separate source or the same source whose direction is reversed. In the case where the same reference source is used both may be derived from the same laser source. However, where a separate second reference source is used for the replay, this need not be a laser source, but could be a source in which a strong spectral line is used, and the method would then include the additional step of filtering out the unwanted radiation on either side of the spectral line.

Where an Argon laser source is used as the input and reference beams, a mercury lamp could be used as the second reference source for the replay step (c) referred to above.

In order to ensure that a correct depth of focus is achieved in forming an image of the hologram on the silicon slice, an additional step of moving the silicon slice vertically during exposure is provided. Such vertical movement of the silicon slice is preferably achieved by providing a piezo-electric spacer whose thickness is varied by the application of a voltage.

DESCRIPTION OF THE DRAWINGS

The present invention will now be described in greater detail by way of example with reference to the remaining figure of the accompanying drawings, wherein.

DESCRIPTION OF THE PREFERRED EMBODIMENTS

Figure 2:
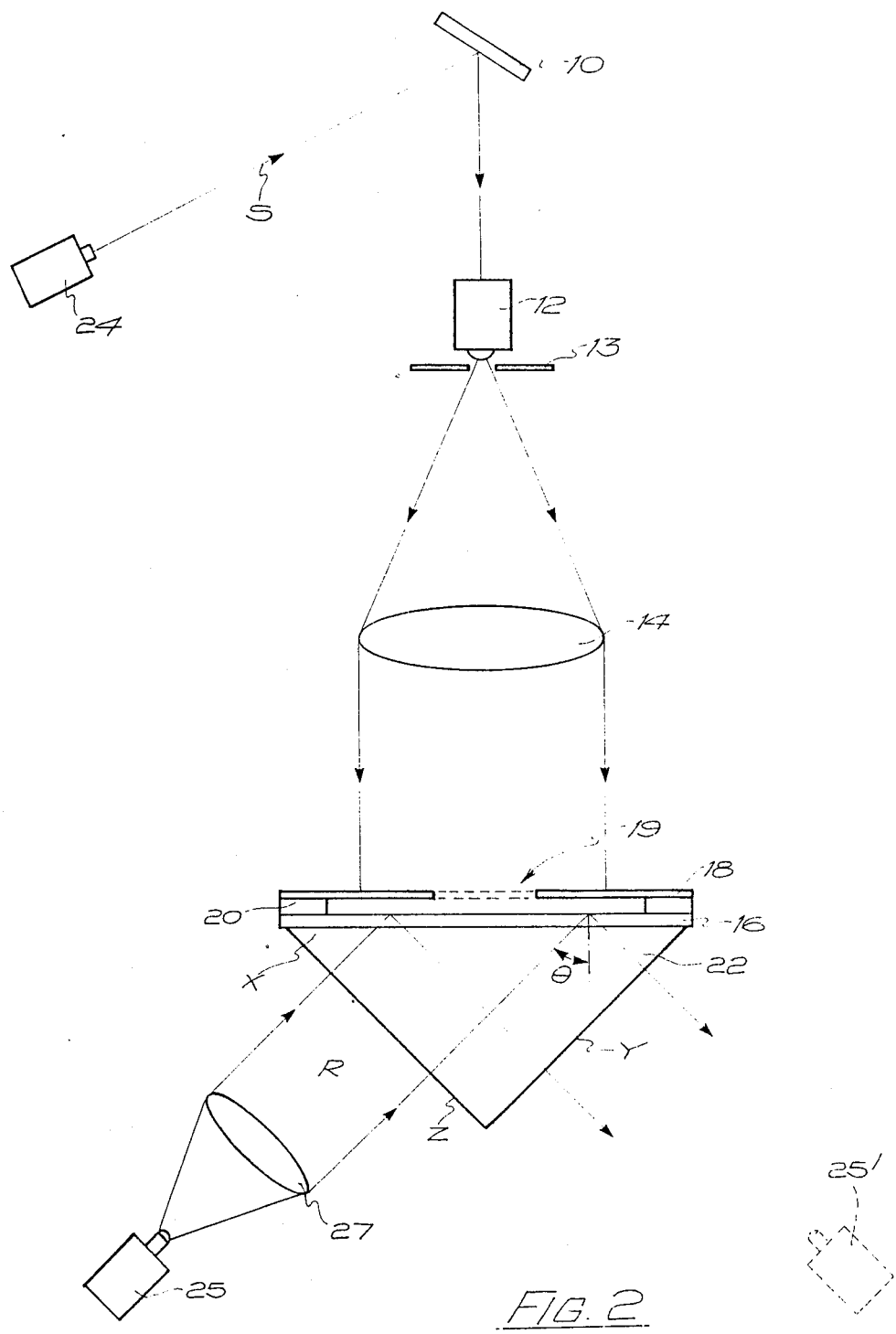
FIG. 2 is a diagrammatic arrangement of one preferred construction for the manufacture of integrated circuits using holographic techniques.

As shown in FIG. 2, the apparatus comprises an apex mirror 10; an expansion lens 12; a pinhole filter 13; a collimating lens 14; a glass slab 16 on which a recording emulsion is coated to enable a volume hologram to be formed; a mask 18 positioned above the glass slab 16; spacers 20 which separate the mask 18 from the glass slab 16; and a prism 22. A volume hologram is one which exhibits its image forming properties from the volume of the material of the hologram, as distinct from surface relief holograms. The refractive index of the prism is the same as the glass slab 16. The mask 18 carries a mask window 19 on which the object, for example in the form of an integrated circuit to be reproduced, is encoded. In practice the laser sources 24 and 25 are the same source, which is split for convenience. However, it is perfectly possible to use two separate laser sources if the frequencies are synchronized.

An input beam S (the subject beam referred to hereinabove) is a beam of coherent light generated by a laser source 24. A reference beam R is another laser beam generated by a separate source 25 through a collimating lens 27. In order that the beam is adequately uniform in intensity across its section, antigaussian devices would be incorporated into the primary beam from the lasers 24 and 25. The reference beam R is projected substantially normal to one of the shorter faces Z of the prism 22. It passes through the junction between the glass slab 16 and the longest face X of the prism 22. It is internally reflected by the upper face of the glass slab 16 and exits through the other shorter face Y of the prism 22 substantially normally thereto. The angle $\theta$ at which the reference beam R is reflected with respect to the normal of the upper surface of the glass slab 16 is greater than the critical angle $\theta_c$ for total internal reflection, the critical angle $\theta_c$ being defined by $\sin^{-1}(1/n)$ where n is the refractive index of the prism 22.

The input beam or subject beam S on emission from the laser source 24 is reflected by the apex mirror 10 to enter the expansion lens 12 substantially normally to its longitudinal axis. The pin-hole filter 13 which is positioned at the exit of the expansion lens 12 ensures that the expanded laser beam diverges as a symmetrical cone of coherent light. The diverging rays of coherent light then pass through the collimating lens 14 and the antigaussian device referred to above so that the rays exit therefrom all parallel to one another and uniformly distributed. The rays then pass through the mask window 19 and also through the recording emulsion on the glass slab 16 so as to interfere with both the incident and reflected reference beam to form a holographic image in the recording emulsion of the object on the mask window 19.

It will be appreciated from the above description that a holographic image of the object in the mask window 19 has been encoded on the recording emulsion of the glass slab.

It will be appreciated that the recording emulsion must exhibit minimal levels of scatter in order to insure total internal reflection of light at the hologram surface. For example, advances in diochromated gelatin technology make this medium appropriately suitable. It is the intention to apply the method with the emphasis on hydrophobic polymeric compounds which are now becoming available. It will be further appreciated that not only do the materials have to provide the resolution required, but also exhibit a very low scatter. It is imperative that the materials neither shrink or expand, nor exhibit unflatness during the course of manufacture of the holographic image.

In order now to reproduce a plurality of silicon slices from the holographic image, the mask window 19 is removed and the slice is introduced in its place. Thus when the laser sources 24 and 25 are switched on to replay, the image from the hologram can be created as a real image on the photo-resist recording medium of the silicon slice if the direction of the reference light is reversed, so that it enters at the face Y of the prism, is totally internally reflected at the upper surface of the glass slab 16 and exits at face Z. As shown in FIG. 2, the reference beam R emanates from the position 25', either by moving the laser source 25 through 90° for the reply operation (where separate laser sources are provided) or by moving the beam splitting mechanism through 90° in the case where a single laser source is used.

In the manufacturing technique the silicon slices are automatically positioned on the spacers, left for a predetermined exposure time, and them removed therefrom to a store location.

In order to ensure the accurate focusing of the holographic image on the silicon slice, the spacer can be replaced by an active type of device such as a piezo-electric spacer whose thickness is variable by the application of a voltage. The piezo-electric spacer is energized from a suitable variable voltage source, whose voltage may be varied between 0 and 150 volts by manual adjustment. The greater the voltage applied to the piezo-electric element, the more it expands. This achieves a mobility in the focus which allows for a degree of unflatness in the surface of the silicon slice.

Figure 1:
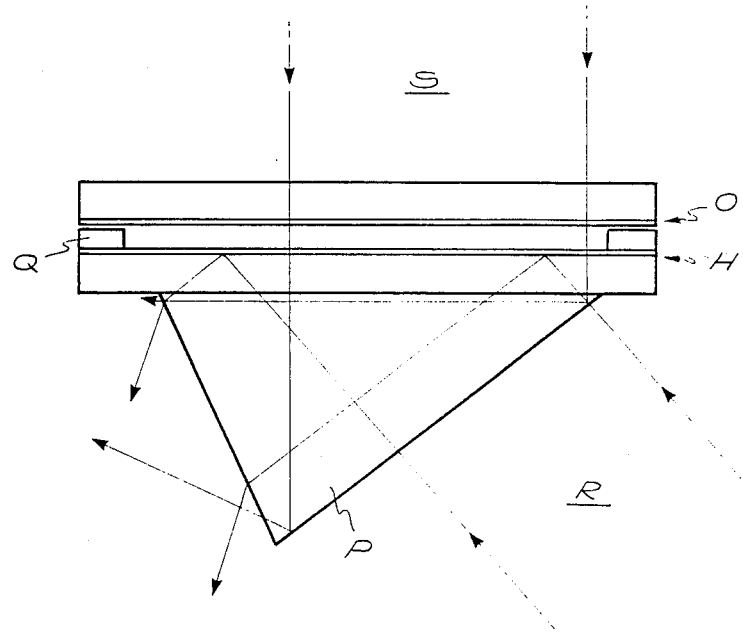
Figure 3:
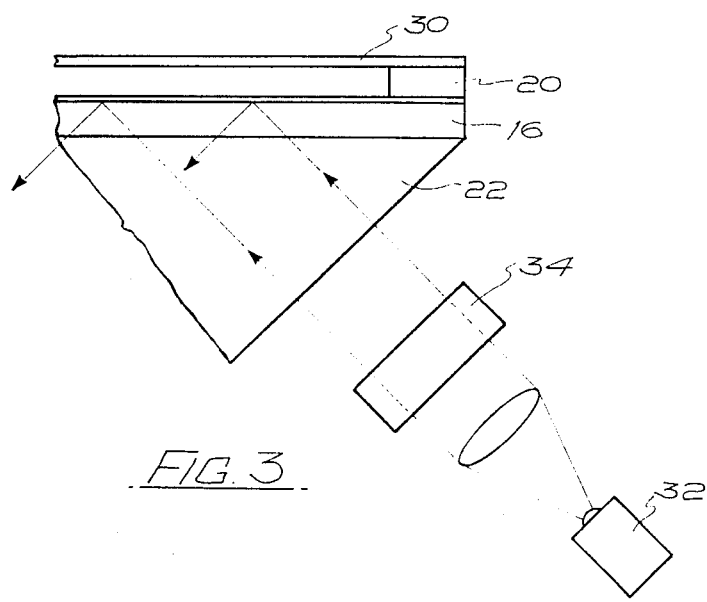
FIG. 3 is a part diagrammatic arrangement of a first alternative construction which uses a second reference beam in the playback operation.

As shown in FIG. 3, in the replay operation in order to reproduce the silicon slices 30, instead of using a single laser source or a pair of synchronized laser sources, one may use a mercury lamp 32 and use one of the strong lines in the spectrum filtering out all the other frequencies above and below by means of a filter 34. The spectral line chosen must have approximately the same frequency as an Argon laser source used for the sources 24 and 25 in the formation of the hologram on the recording medium. For example, one may use the 363.8 nm line of the argon laser in correspondence with the 365 nm line of a mercury discharge lamp. The ultra-violet line offers sensitivity advantages of the hologhraphic recording material. It also provides improved resolution because of the reduced wavelength of light, and improved resist sensitivity. Furthermore there is no need to use a sensitizer in suitable polymeric materials.

In the printing of the image on the silicon slices following on the recording of the hologram it is possible to overcome the depth of focus problem of such precision imagery by simply moving the silicon slices in a vertical direction using a piezo electric moving device in the printing stage. When one considers the structure proposed by K. A. Stetson for the printing and hologram forming geometry it will be realized that the spacer which is placed between the mask window and the hologram during the formation of the original image is far from ideal. As mentioned above, it would thus be possible to replace the spacer with an active type of device in the form of a piezo electric spacer which could have its thickness altered by application of a voltage. This would allow the silicon slice to be placed in position above the hologram so that it could be moved vertically during the course of subsequent exposure. This would enable one to solve the problem of focusing the image bearing in mind that with such an enormous aperture of recording the focal point together with the precision of the image will be of the order of the wave length of light. With the proposed construction as outlined in FIG. 2, an important feature of the optical system is that the incoming reference beam from the laser source 25 is reflected internally off the surface of the holographic layer and the light coming through the mask window 19 actually interferes both with the incident and internally reflected reference beam producing a transmission hologram which when it is played backwards produces a real image of the object positioned at the mask window. Thus essentially any light that is not being usefully employed to form the holographic image of interest is simply dumped by reflection off the surface of the holographic material.

Whilst the replay operation, described in connection with FIGS. 2 and 3 reproduces a holographic image on a silicon slice in one exposure operation, in a modified form of the above system a scanning technique can be used to progressively build up a holographic image of the printed circuit on the silicon slice. This overcomes the problem of exposure uniformity at the silicon slice. It also permits the continuous adjustment of the separation of the silicon slice from the glass slab thus permitting a smooth and continuous adjustment of the focus of the projected image to allow for unflatness of the silicon slices. Automatic focusing is achieved during the scanning by means of an optical monitoring system such as a zone plate which operates from the underside of the silicon slice. Scanning also permits local adjustment of image scale to allow for the shrinkage of the silicon slice during processing. A further method of adjustment of the slope of the conjugate reference beam could also be employed for overcoming the problem of shrinkage during processing. This could be achieved by the use of magnetic elements surrounding the filter 34 of the FIG. 3 embodiment or phase conjugate mirror 48 in case of the FIG. 4 embodiment to be described.

Figure 4:
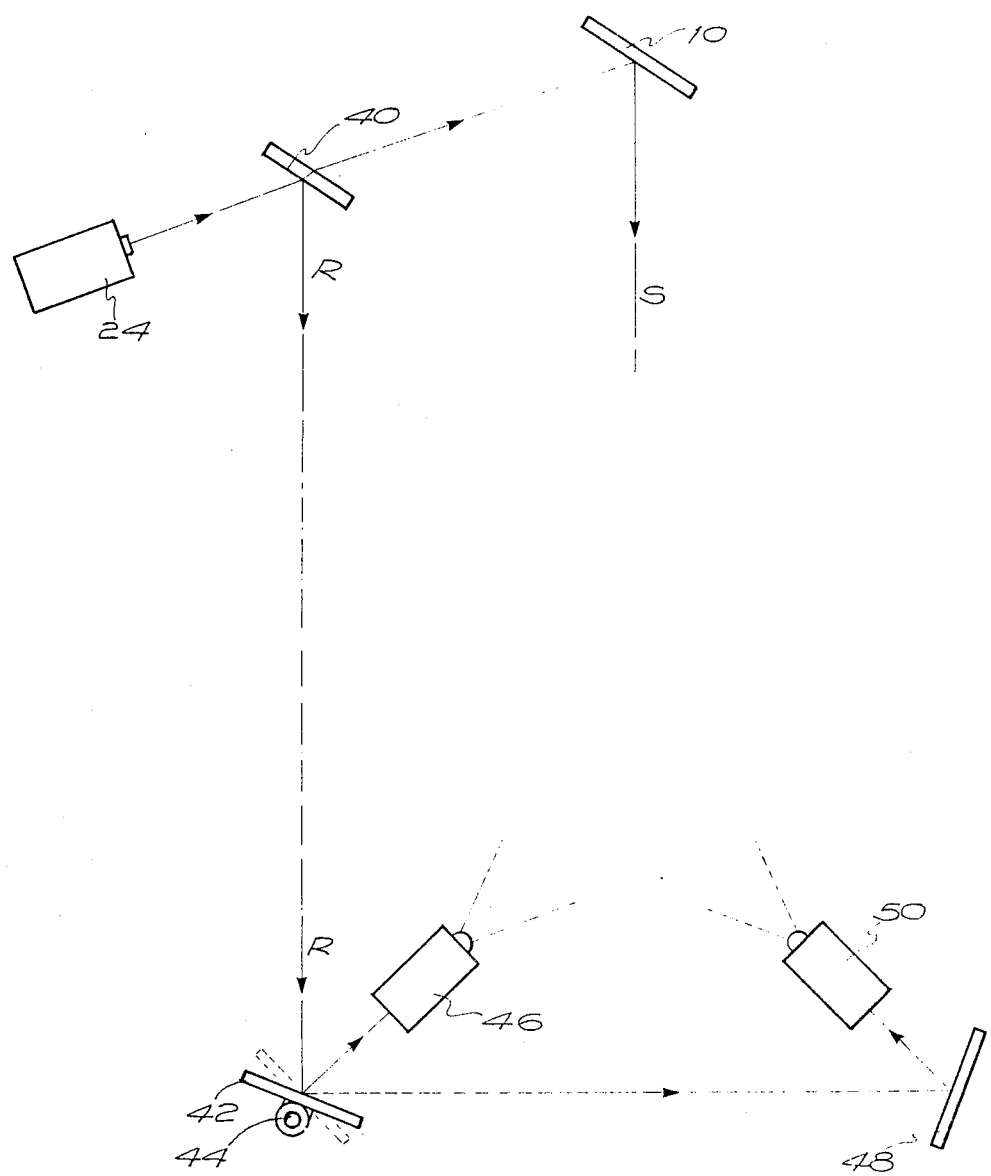
FIG. 4 is a part diagrammatic arrangement of a second alternative construction which uses only a single laser source.

Referring now to FIG. 4, the apparatus illustrates an alternative construction where only a single laser source is used. The laser 24 provides both the input beam S and the reference beam R, by means of a beam splitter 40. The input beam S passes through the beam splitter 40 to the apex mirror 10 as in the case of the main embodiment shown in FIG. 2. The reference beam R is reflected off the front face of the beam splitter 40, and directed to a movable mirror 42. Due to the polarization of the laser source 24, the reference beam R has a continuously variable transmission from maximum down to zero. The mirror 42 is movable from a position shown in full lines to a position shown in dotted lines by rotation about a pivot point 44 by means (not shown). In the position shown in full lines, the reference beam R is directed to an expansion lens 46 and thence through the collimating lens 27 so as to project substantially normally onto the face Z of the prism 22. In the replay position shown in dotted lines, the reference beam R is directed on an expansion lens 50 via the mirrors 42 and 48 so as to project substantially normally onto the face Y of the prism 22.

With the above described constructions for the holographic reproduction of an integrated circuit, the following important points and advantages are realized:

(a) It is thus now possible to reproduce very high precision holograms with resolutions well into the sub-micron range.

(b) The holographic image produced is substantially free from speckle, a problem which prevented previous attempts to reproduce a holographic image of an integrated circuit in the sub-micron range.

(c) By utilizing the technique of interference between the subject and reference beams upon the total internal reflection of reference beam, it is possible to literally throw away light which would otherwise be an embarrassment in the printing of the holographic image.

(d) By moving the silicon slice, which is to be holographically printed in the vertical direction, accurate-focus of the holographic image thus produced is ensured.

(e) Once having formed the holographic image on the recording medium, the actual printing of the silicon slices from the hologram is a relatively easy task and accurate reproduction is ensured for any desired number of products produced by this technique.

(f) In the normal course of events with incoherent imaging, a lens of considerable cost and severe optical limitation is normally employed. A holographic scheme as proposed above, obviates the need for this expensive item.

What is claimed is:

1. A method of manufacturing integrated circuits using holographic techniques including the steps of:
    (a) providing a first recording medium exhibiting negligible scatter and high resolution without shrinking or distorting during the course of manufacture.
    (b) forming a volume holographic image of the integrated circuit on the first recording medium by interference between an input beam of coherent light which passes through a mask window containing the design of the integrated circuit, and a reference beam of coherent light which is totally internally reflected at the surface on which the recording medium is located, the interference taking place both with the incident and the reflected reference beam;
    (c) removing the mask window and placing in its place a silicon slice having a second recording medium on which the formed holographic image is to be reproduced;
    (d) forming an image of the hologram on the second recording medium of the silicon slice by interference between the input beam and another reference beam which travels in the reverse direction from the first reference beam which formed the hologram; and (e) repeating step (d) with another silicon slice as many times as required to manufacture a plurality of silicon slices containing an image of the integrated circuit formed thereon.

2. The method according to claim 1, wherein the second reference beam is provided by the same source as that which provides the first reference beam.

3. The method according to claim 1, wherein the first reference beam is provided by a laser and the second reference beam is provided by a source in which a strong spectral line is used, said method including the additional step of filtering out the unwanted radiation on either side of the spectral line.

4. The method according to claim 3, wherein an argon laser is used to provide the input and first reference beam, and a mercury lamp is used to provide the second reference beam.

5. The method according to claim 1, wherein it includes an additional step of moving the silicon slice vertically during exposure.

6. The method according to claim 5, wherein said vertical movement is achieved by the application of a voltage to a piezo-electric spacer in order to vary the thickness thereof.

7. A method of manufacturing integrated circuits using holographic techniques including the steps of:
(a) providing a first recording medium exhibiting negligible scatter and high resolution without shrinking or distorting during the course of manufacture.
(b) generating an input beam and first and second reference beams from a source of coherent light;
(c) forming a volume holographic image of the integrated circuit on the first recording medium by interference between the input beam which passes through a mask window containing the design of the integrated circuit, and the first reference beam which is totally internally reflected at the surface on which the recording medium is located, the interference taking place both with the incident and the reflected reference beam;
(d) removing the mask window and placing in its place a silicon slice having a second recording medium on which the formed holographic image is to be reproduced;
(e) forming an image of the hologram on the second recording medium of the silicon slice by interference between the input beam and the second reference beam which travels in the reverse direction from the first reference beam which formed the hologram; and
(f) repeating step (e) with another silicon slice a plurality of times in order to manufacture a plurality of silicon slices containing an image of the integrated circuit formed thereon.

8. The method according to claim 7, wherein the source of coherent light is provided by an argon laser.

9. A method of manufacturing integrated circuits using holographic techniques including the steps of:
(a) providing a first recording medium exhibiting negligible scatter and high resolutions without shrinking or distortion;
(b) generating an input beam and a first reference beam from an argon laser;
(c) generating a second reference beam from a source in which a strong spectral line is used:
(d) filtering out the unwanted radiation on either side of the spectral line;
(e) forming a volume holographic image of the integrated circuit on the first recording medium by interference between the input beam which passes through a mask window containing the design of the integrated circuit, and the first reference beam which is totally internally reflected at the surface on which the recording medium is located, the interference taking place both with the incident and the reflected reference beam;
(f) removing the mask window and placing in its place a silicon slice having a second recording medium on which the formed holographic image is to be reproduced;
(g) forming an image of the hologram on the second recording medium of the silicon slice by interference between the input beam and the second reference beam which travels in the reverse direction from the first reference beam which forms the hologram;
(h) moving the silicon slice vertically during exposure to achieve the required depth of focus; and
(i) repeating step (g) with a series of silicon slices as many times as required so as to manufacture the required number of silicon slices each containing an image of the integrated circuit formed thereon.

10. The method according to claim 9, wherein the source which generates the second reference beam is a mercury lamp.

11. The method according to claim 10, wherein the argon laser emits radiation in the ultra-violet region of the electromagnetic spectrum and the strong spectral line of the mercury lamp is also in the ultra-violet region within a few n.m. of the argon laser.

12. The method according to claim 9, wherein said vertical movement is achieved by means of a piezo-electric spacer, and the method includes the additional step of applying a voltage thereto in order to vary the thickness thereof.

13. A method of manufacturing integrated circuits using holographic techniques including the steps of:
(a) providing a first recording medium exhibiting negligible scatter and high resolution without shrinking or distorting;
(b) generating from a single laser source an input beam;
(c) splitting from said input beam, a reference beam;
(d) forming a volume holographic image of the integrated circuit on the first recording medium by interference between the input beam which passes through a mask window containing the design of the integrated circuit, and the reference beam which is totally internally reflected at the surface on which the recording medium is located, the interference taking place both with the incident and the reflected reference beam;
(e) removing the mask window and placing in its place a silicon slice having a second recording medium on which the formed holographic image is to be reproduced;
(f) redirecting the reference beam so as to travel in the reverse direction from that reference beam which formed the hologram;
(g) forming an image of the hologram on the second recording medium of the silicon slice by interference between the input beam and the redirected reference beam; and
(h) repeating step (g) with another silicon slice as many times as required to manufacture a plurality of silicons slices containing an image of the integrated circuit formed thereon.

14. The method according to claim 13, including the additional step of moving the silicons slice vertically during exposure in order to obtain the desired depth of focus.

15. The method according to claim 14, wherein said step of moving the silicon slice vertically is achieved by means of a piezo-electric spacer to which a voltage is applied in accordance with the movement desired to produce the required depth of focus.

* * * * *